US010459054B2

(12) United States Patent
Grodzki

(10) Patent No.: US 10,459,054 B2
(45) Date of Patent: Oct. 29, 2019

(54) METHOD AND APPARATUS FOR IMPLEMENTING A DIFFUSION-WEIGHTED MAGNETIC RESONANCE MEASUREMENT

(71) Applicant: Siemens Healthcare GmbH, Erlangen (DE)

(72) Inventor: David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 160 days.

(21) Appl. No.: 15/718,351

(22) Filed: Sep. 28, 2017

(65) Prior Publication Data
US 2018/0088198 A1 Mar. 29, 2018

(30) Foreign Application Priority Data
Sep. 28, 2016 (DE) .................. 10 2016 218 713

(51) Int. Cl.
*G01R 33/56* (2006.01)
*G01R 33/36* (2006.01)
(Continued)

(52) U.S. Cl.
CPC ......... *G01R 33/5602* (2013.01); *G01R 33/36* (2013.01); *G01R 33/4816* (2013.01); *G01R 33/543* (2013.01); *G01R 33/56341* (2013.01)

(58) Field of Classification Search
CPC ................ G01R 33/5602; G01R 33/36; G01R 33/4816; G01R 33/543; G01R 33/56341; G01R 33/5615; G01R 33/5616
(Continued)

(56) References Cited

U.S. PATENT DOCUMENTS 4,616,183 A * 10/1986 Glover ................ G01R 33/565
324/309
5,235,279 A * 8/1993 Kaufman ............. G01R 33/385
324/309
(Continued)

OTHER PUBLICATIONS

Maier, "Slab Scan Diffusion Imaging," Magnetic Resonance in Medicine, vol. 46, pp. 1136-1143 (2001).
(Continued)

*Primary Examiner* — Patrick Assouad
*Assistant Examiner* — Demetrius R Pretlow
(74) *Attorney, Agent, or Firm* — Schiff Hardin LLP

(57) ABSTRACT

The method and magnetic resonance apparatus for acquiring diffusion-weighted measurement data from a subject, (a) a diffusion module is activated that contains at least one diffusion gradient, and (b) an acquisition module is activated, which reads out measurement data by repetitions of RF excitation pulses, which are applied to the subject under examination, and phase-encoding gradients that are activated to spatially encode signals induced by the RF pulses. For at least one repetition, the RF excitation pulse are applied to the subject only if the phase-encoding gradients, activated for the spatially encoding signals, which are generated after the RF excitation pulse, have already reached their required strength. Steps (a) and (b) are repeated until all the required measurement data are acquired. The acquired measurement data are stored. A significant reduction in the noise level of DWI measurements is thereby achieved.

15 Claims, 3 Drawing Sheets

(51) Int. Cl.
*G01R 33/54* (2006.01)
*G01R 33/48* (2006.01)
*G01R 33/563* (2006.01)

(58) Field of Classification Search
USPC .................................................. 324/309
See application file for complete search history.

(56) References Cited

U.S. PATENT DOCUMENTS

| | | | | |
|---|---|---|---|---|
| 5,545,991 | A * | 8/1996 | Nauerth | G01R 33/4818 324/307 |
| 5,833,609 | A * | 11/1998 | Dannels | G01R 33/56341 600/410 |
| 6,185,444 | B1 * | 2/2001 | Ackerman | G01N 24/08 324/309 |
| 6,275,036 | B1 * | 8/2001 | van Yperen | G01R 33/56341 324/306 |
| 7,355,407 | B1 * | 4/2008 | Zhang | G01R 33/5616 324/309 |
| 8,878,533 | B2 | 11/2014 | Grodzki et al. | |
| 8,928,319 | B2 * | 1/2015 | Feiweier | G01R 33/56518 324/306 |
| 2003/0083569 | A1 * | 5/2003 | Edelman | G01R 33/56375 600/410 |
| 2005/0218893 | A1 * | 10/2005 | Kumai | A61B 5/7257 324/309 |
| 2006/0001424 | A1 * | 1/2006 | Harvey | G01R 33/4641 324/309 |
| 2006/0066307 | A1 * | 3/2006 | Hinks | G01R 33/56554 324/309 |
| 2006/0139027 | A1 * | 6/2006 | Dreher | G01R 33/485 324/307 |
| 2007/0055137 | A1 * | 3/2007 | Feiweier | G01R 33/5616 600/410 |
| 2010/0277173 | A1 | 11/2010 | Landschuetz et al. | |
| 2011/0112393 | A1 * | 5/2011 | Taniguchi | A61B 5/055 600/410 |
| 2013/0147478 | A1 * | 6/2013 | Zhou | G01R 33/4824 324/309 |
| 2013/0158384 | A1 | 6/2013 | Jeong et al. | |
| 2013/0249555 | A1 * | 9/2013 | Chen | G01R 33/561 324/309 |
| 2014/0097840 | A1 * | 4/2014 | Grodzki | G01R 33/4816 324/312 |
| 2014/0145718 | A1 | 5/2014 | Gulaka et al. | |
| 2014/0219533 | A1 * | 8/2014 | Sato | A61B 5/055 382/131 |
| 2015/0108981 | A1 * | 4/2015 | Grodzki | G01R 33/3671 324/318 |
| 2015/0115960 | A1 * | 4/2015 | Grodzki | G01R 33/34 324/309 |
| 2015/0160317 | A1 * | 6/2015 | Grodzki | G01R 33/543 702/57 |
| 2015/0204959 | A1 * | 7/2015 | Grodzki | G01R 33/543 324/314 |
| 2015/0253408 | A1 * | 9/2015 | Grodzki | G01R 33/307 324/309 |
| 2016/0161580 | A1 * | 6/2016 | Shirai | A61B 5/055 324/322 |
| 2018/0017650 | A1 * | 1/2018 | de Oliveira | G01R 33/4818 |

OTHER PUBLICATIONS

Dietrich et al., "Technical aspects of MR diffusion imaging of the body," Europe Journal of Radiology, vol. 76, pp. 314-322 (2010).
Carl et al., "Diffusion Weighted 3D UTE Imaging Using Stimulated Echoes: Technical Considerations," ISMRM; Proc. Intl. Soc. Mag. Reson. Med., vol. 24, 3021 (2016).
Weiger et al., "MRI with Zero Echo Time: Hard versus Sweep Pulse Excitation," Magnetic Resonance in Medicine, vol. 66, pp. 379-389 (2011).

* cited by examiner

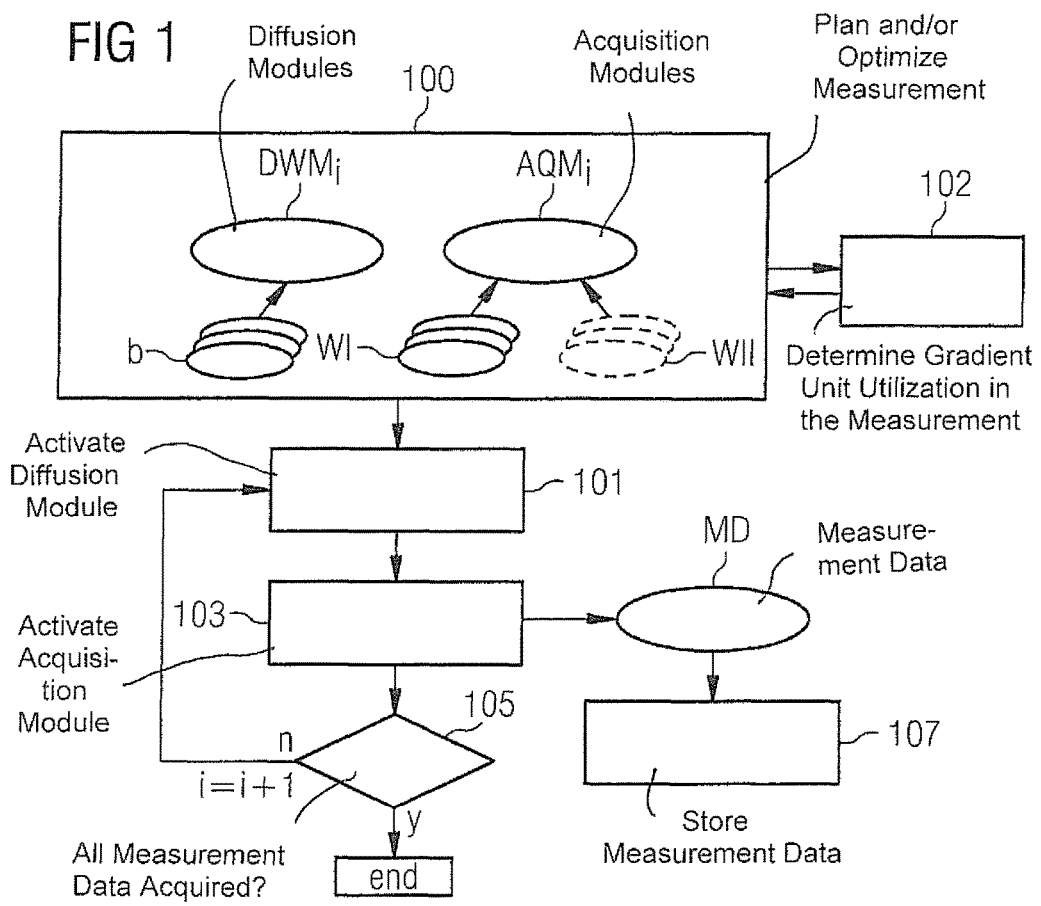
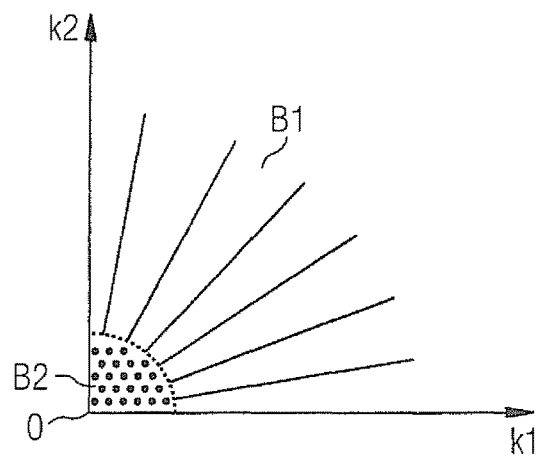

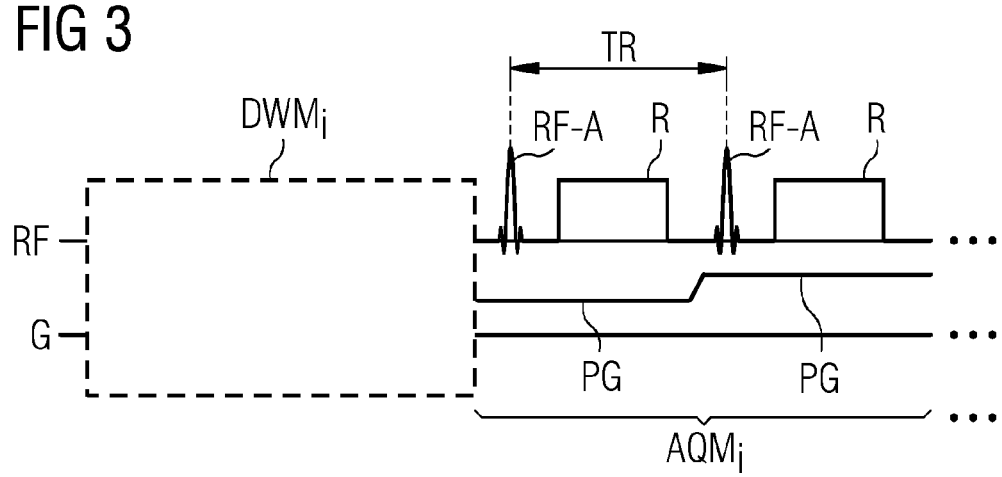
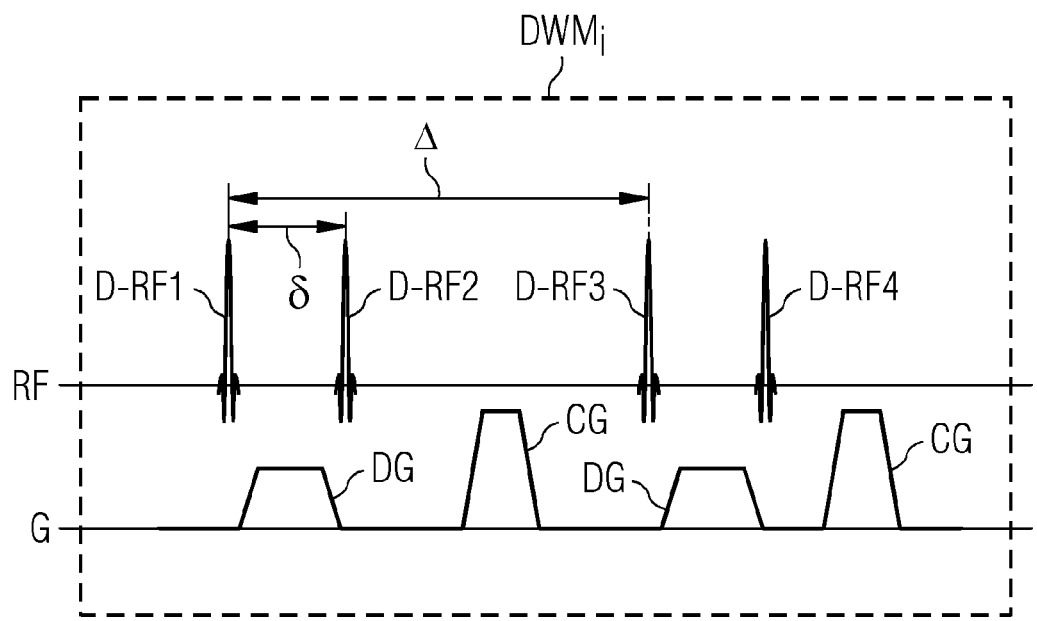

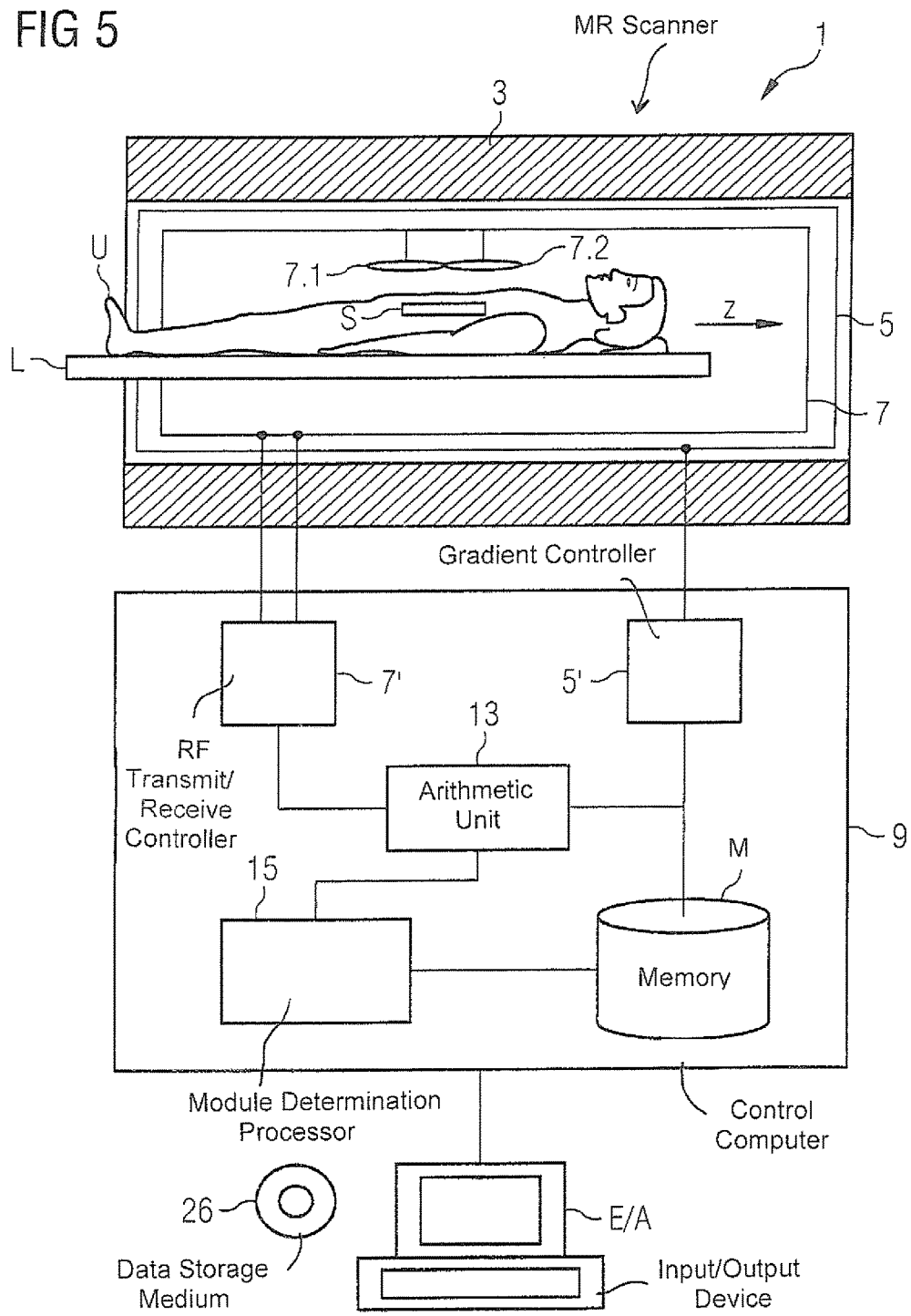

METHOD AND APPARATUS FOR IMPLEMENTING A DIFFUSION-WEIGHTED MAGNETIC RESONANCE MEASUREMENT

BACKGROUND OF THE INVENTION

Field of the Invention

The invention concerns a method for diffusion-weighted magnetic resonance measurements, in particular for implementing relatively quiet diffusion-weighted magnetic resonance measurements, and to a magnetic resonance scanner for performing such a method.

Description of the Prior Art

Magnetic resonance (MR) technology is a known modality that can be used to generate images of the inside of a subject under examination. In simple terms, this is done by placing the subject under examination in a magnetic resonance scanner in a strong static, homogeneous basic magnetic field, also called the $B_0$ field, at field strengths of 0.2 Tesla to 7 Tesla and higher. This causes nuclear spins of the subject to be oriented along the basic magnetic field. Radio frequency excitation pulses (RF pulses, also known as the $B_1$ field) are applied to the subject under examination in order to induce nuclear spin resonances. The induced nuclear spin resonances are measured as what is known as k-space data, which are used as the basis for reconstructing MR images or obtaining spectroscopic data. Rapidly switched magnetic gradient fields are superimposed on the basic magnetic field for spatially encoding the measurement data. The recorded measurement data is digitized and stored as complex numerical values in a k-space matrix. An associated MR image can be reconstructed from the k-space matrix, populated with such values, using a multidimensional Fourier transform, for example.

Diffusion-weighted magnetic resonance (MR) images can provide important diagnostic information in common clinical situations, for instance in stroke and tumor diagnosis. In diffusion-weighted imaging (DWI), diffusion gradients are activated in certain directions, and the diffusion of water molecules along the applied diffusion gradients attenuates the measured magnetic resonance signal. In regions of lower diffusion, there is hence lower signal attenuation, with the result that these regions are imaged at higher image intensity in a magnetic resonance imaging (MRI) measurement. The strength of the diffusion weighting is correlated with the strength of the applied diffusion gradients. The diffusion weighting can be characterized by what is known as the b-value, which is a function of gradient parameters such as the gradient strength, the duration or the time interval between the applied diffusion gradients. An acquisition sequence such as an echo planar imaging (EPI) sequence, for instance, is used to capture the resultant magnetic resonance signals.

In diffusion imaging, different diffusion directions and weightings (characterized by the b-value) are normally used to capture a number of images, which are combined with one another in order to compute, for example, parameter maps (Apparent Diffusion Coefficient ADC, Fractional Anisotropy FA). The review article by Dietrich et al., "Technical aspects of MR diffusion imaging of the body", European Journal of Radiology 76, p. 314-322, 2010 gives an overview of known DWI techniques.

The article by Carl et al., "Diffusion Weighted 3D UTE imaging Using stimulated Echoes: Technical Considerations" Proc. Intl. Soc. Mag. Reson. Med. 24, p. 3021, 2016 describes a UTE-DWI technique, which can be used to examine even tissues that have short T2 values (T2: transverse magnetization relaxation rate).

Besides the UTE sequence, other known sequences which can be used to measure also tissues that have short T2 values are zTE ("zero echo time") and PETRA ("pointwise encoding time reduction with radial acquisition") sequences, which are described in the article by Weiger et al., "MRI with Zero Echo Time: Hard versus Sweep Pulse Excitation" Magnetic Resonance in Medicine 66: p. 379-389, 2011, and in U.S. Pat. No. 8,878,533 B2.

As a result of the (diffusion) gradients to be activated for the diffusion encoding, DWI techniques are among those measurement techniques that place the highest demands on the gradient system of the magnetic resonance scanner being used. This also results in a very loud sound during DWI measurements. Many patients find this unpleasant and it can even cause the patient to refuse the DWI measurement.

US 20150253408 A1 describes a method that can be used to reduce the noise produced by EPI sequences and which can also be used in conjunction with EPI-DWI measurements to achieve a considerable reduction in the noise level of the EPI-DWI measurement. Nevertheless, patients can still find the residual noise level unpleasant.

SUMMARY OF THE INVENTION

An object of the present invention is to facilitate quiet DWI measurements that have a noise level that is acceptable to as many patients as possible.

The method according to the invention for acquiring diffusion-weighted measurement data from a subject under examination has the following steps.

(a) A diffusion module containing at least one diffusion gradient, is activated.

(b) An acquisition module is activated, which reads out measurement data by repetitions of RF excitation pulses, which are applied to the subject under examination, and phase-encoding gradients activated for the purpose of spatial encoding. For at least one repetition, the RF excitation pulse is applied to the subject under examination only when the phase-encoding gradients, which are activated for the purpose of spatially encoding the signals to be measured that are generated after the RF excitation pulse, have already reached their required strength.

(c) Steps (a) and (b) are repeated until all the required measurement data are acquired.

(d) The acquired measurement data are provided in electronic form for storage.

The use of repetitions according to the invention to acquire the measurement data, in which repetitions the RF excitation pulse is not applied until phase-encoding gradients, which are to be activated for the purpose of spatial encoding of the signals to be measured that are generated after the RF excitation pulse, have already reached their required strength, significantly reduces the noise level caused by the measurement, thereby facilitating quiet DWI measurements. Diffusion data, for instance parameter maps of the apparent diffusion coefficient ADC or of the fractional anisotropy FA, on the subject under examination can be obtained from the stored measurement data.

Repetitions based on a zTE sequence or based on a PETRA sequence can be used in the acquisition modules.

A magnetic resonance apparatus according to the invention has a scanner with a basic field magnet, a gradient coil arrangement, an RF antenna, and a control computer designed to perform the method according to the invention, which has a module determination processor.

The present invention also encompasses a non-transitory, computer-readable data storage medium encoded with programming instructions (program code) that, when the storage medium is loaded into a computer or computer system of a magnetic resonance apparatus, cause the computer or computer system to be operated in order to implement any or all embodiments of the method according to the invention, as described above.

The advantages and embodiments described with regard to the method apply as well to the magnetic resonance apparatus and to the electronically readable data storage medium.

BRIEF DESCRIPTION OF THE DRAWINGS

FIG. 1 is a flowchart of the method according to the invention.

FIG. 2 schematically shows an example of k-space sampling, on the basis of which measurement data can be acquired using the method according to the invention.

FIG. 3 is a simplified sequence diagram according to the invention.

FIG. 4 shows an example of a module according to the invention.

FIG. 5 schematic illustrates a magnetic resonance apparatus according to the invention;

DESCRIPTION OF THE PREFERRED EMBODIMENTS

FIG. 1 is a flowchart of the method according to the invention for acquiring diffusion-weighted measurement data from a subject under examination.

In the method, a diffusion module $DWM_i$ containing at least one diffusion gradient is activated (block 101). At the end of the diffusion module $DWM_i$, an acquisition module $AQM_i$ is activated (block 103), which reads out measurement data MD by repetitions WI, WII of RF excitation pulses, which are radiated into the subject under examination, and phase-encoding gradients activated for the purpose of spatial encoding. For at least one repetition, the RF excitation pulse is applied to the subject under examination only when phase-encoding gradients, which are activated for the spatial encoding of the signals to be measured that are generated after the RF excitation pulse, have already reached their required strength. FIG. 3 shows in simplified form two repetitions in an acquisition module $AQM_i$ after a diffusion module $DWM_i$ as an example. In one repetition, first an RF excitation pulse RF-A is used to set the magnetization of the spins in the subject under examination, and the resultant signal is acquired as measurement data in a readout process R. In this case, a phase-encoding gradient PG is activated for the purpose of spatial encoding, and has already reached its required strength when the RF excitation pulse RF-A is applied. After a repetition period TR, at least one further repetition is performed, if applicable using different phase-encoding gradients. An example of a diffusion module $DWM_i$ that can be used in a method according to the invention is described below with reference to FIG. 4.

The measurement data MD that have been read out are stored in a memory of a magnetic resonance apparatus (block 107).

After activating a diffusion module $DWM_i$ (block 101) and the subsequent activation of an acquisition module $AQM_i$ (block 103), a check is made as to whether all the required measurement data MD are already acquired (query 105). If all the required measurement data MD have already been acquired ("y", query 102), the measurement is ended ("end"). If all the required measurement data MD have not yet been acquired ("n", query 105), the counter i for the modules is incremented by one ("i=i+1") and activation of a next diffusion module $DWM_i$ (block 101) and of a next acquisition module $AQM_i$ (Block 103) is performed. Hence the activation of the diffusion modules $DWM_i$ (block 101) and of the acquisition modules $AQM_i$ is repeated until all the required measurement data MD are acquired.

The diffusion modules $DWM_i$, in particular the diffusion gradients contained in a diffusion module $DWM_i$, can be different for each repeated activation of a diffusion module $DWM_i$.

The exact sequence of the diffusion modules $DWM_i$ and acquisition modules $AQM_i$ to be activated can be planned, and if necessary optimized, before starting the measurement (block 100). The acquisition modules $AQM_i$ and diffusion modules $DWM_i$, which are to be activated anyway, are basically defined by parameters such as a required resolution and a required image segment, and are obtained from the corresponding specification of what measurement data and what b-values b are intended to be obtained.

At least one of the acquisition modules $AQM_i$ to be activated contains repetitions WI of a first type. In these repetitions, phase-encoding gradients, which are activated for the spatially encoding the signals to be measured after an RF excitation pulse of the first type of repetition, have already reached their required strength when the RF excitation pulse is applied to the subject under examination. Also in these repetitions, measurement data are read out from a first region, which does not include the center of k-space. Such repetitions WI of the first type acquire measurement data in k-space along radial k-space trajectories. FIG. 2 shows schematically such radial k-space trajectories in a first region B1 of k-space, which does not include the center 0 of k-space. In this case, FIG. 2 shows only a quadrant of k-space, which can be expanded symmetrically. The first type of repetitions WI can acquire measurement data MD on the basis of the radial portion of a PETRA sequence or on the basis of a zTE sequence.

In addition, acquisition modules $AQM_i$ to be activated can also contain repetitions WII of a second type. In these repetitions, measurement data are read out from a second region B2, which includes the center 0 of k-space. The second type of repetitions WII can acquire measurement data MD in k-space in a Cartesian form, e.g. point by point, as shown schematically in FIG. 2 in the second region B2. The measurement data can be acquired on the basis of the Cartesian portion of a PETRA sequence.

In this case, only identical repetitions can be performed in an acquisition module $AQM_i$ between two diffusion modules $DWM_i$ and $DWM_{i+1}$, with "identical" meaning that the measurement data are acquired in the same manner e.g. by Cartesian acquisition or by radial acquisition. It is thereby possible to maintain the steady state more easily in an acquisition module $AQM_i$. The acquisition modules $AQM_i$ can be planned so that they are either only the first type of repetitions WI or only the second type of repetitions WII.

In this case, a number of repetitions WI of the first type in an acquisition module $AQM_i$ between two diffusion modules $DWM_i$ and $DWM_{i+1}$, can be chosen to be larger than a number of repetitions WII of the second type in an acquisition module $AQM_i$ between two diffusion modules $DWM_i$ and $DWM_{i\pm 1}$. It is hence possible to obtain an especially advantageous contrast performance, which is dominated by the measurement data acquired in the second region, which includes the center 0 of k-space.

It is also possible for the b-value of a diffusion module $DWM_i$ to decrease as a function of the distance from the center 0 of k-space of the measurement data MD acquired by the acquisition module $AQM_i$ following the diffusion module $DWM_i$. This makes it possible to implement a higher b-value, in particular the b-value actually desired, for measurement data MD that is acquired closer to the center of k-space, for instance for measurement data MD acquired in the second region B2, than for measurement data MD acquired farther from the center of k-space, for instance in the first region B1. If this is the case, a load acting on the gradient unit as a result of the diffusion gradients to be activated can be reduced because lower gradient strengths can be chosen for the diffusion gradients. This also allows diffusion modules $DWM_i$, which are activated before acquisition modules AQMi, to play out the measurement data more quickly in a region of k-space that does not include the center of k-space, i.e. in the first region B1, because lower b-values allow shorter time intervals between diffusion gradients that are activated successively.

It is expected that such a reduction in the b-values, achieved by the diffusion modules $DWM_i$ for measurement data acquired in regions of k-space at a distance from the center of k-space, can take place without a significant impact on the image quality, because the important contrast information is encoded in the center of k-space.

Gradation of this kind in the b-values used can be achieved by a diffusion module $DWM_i$ that is succeeded by an acquisition module $AQM_i$ containing the second type of repetitions WII, having a larger b-value than a diffusion module $DWM_i$ that is succeeded by an acquisition module $AQM_i$ containing only the first type of repetitions WI.

In addition, the planning and/or optimization of the measurement (block 100) can take into account an achieved utilization of the gradient unit, in particular a load acting on the gradient unit as a result of the planned measurement.

For this purpose, a determination is made (block 102) as to the utilization of the gradient unit that is achieved for a currently planned measurement, i.e. for a currently planned sequence of diffusion modules $DWM_i$ and acquisition modules $AQM_i$ (which contain provisionally specified repetitions WI, WII), in other words the load produced by the planned measurement is determined. The determined utilization or load can be used, for example, to obtain an optimally good utilization, or an optimally low load, by varying the planned sequence of diffusion modules $DWM_i$ and acquisition modules $AQM_i$ iteratively. It is also possible merely to check that required threshold values for the utilization or load are met, and only to vary the planned sequence of diffusion modules $DWM_i$ and acquisition modules $AQM_i$ if these values are not met. Hence a sequence of diffusion modules $DWM_i$ and acquisition modules $AQM_i$ can be selected so as to minimize the load on a gradient unit used that is produced as a result of the series of gradients activated successively.

In this case, the load exerted on the gradient unit that is used can be reduced by ensuring that diffusion modules $DWM_i$ having higher b-values, (meaning higher gradient strengths and/or longer gradient durations, and thus longer time periods over which a diffusion gradient DG must be maintained), alternate with diffusion modules $DWM_i$ having lower b-values.

This can be done during the planning 100 by selecting a sequence of diffusion modules $DWM_i$ and acquisition modules $AQM_i$ planned for the total measurement so that measurement data MD from a region including the center 0 of k-space (e.g. in the second region B2), and measurement data MD from a region not including the center 0 of k-space (e.g. the first region B1), in each case are not acquired as one block within the total measurement. It is possible to intermix, according to the number M of planned acquisition modules $AQM_i$ that acquire measurement data MD from a region that includes the center 0 of k-space, and according to a number N of planned acquisition modules $AQM_i$ that acquire measurement data MD from a region that does not include the center 0 of k-space, the acquisitions of the different k-space regions. The acquisitions can be intermixed such that a number n of diffusion modules $DWM_i$, after which measurement data MD were acquired from a region not including the center 0 of k-space, is succeeded by a number m of diffusion modules $DWM_i$, after which measurement data MD were acquired from a region including the center 0 of k-space, where, for the natural numbers n, m, N and M, n<N and m<M. This makes it easier to achieve that diffusion modules $DWM_i$ having higher b-values alternate with diffusion modules $DWM_i$ having lower b-values, which reduces the load on a gradient unit that is used.

The use of repetitions according to the invention that are contained in the acquisition modules $AQM_i$, in which repetitions the RF excitation pulse is not applied until phase-encoding gradients, which are activated for spatially encoding the signals to be measured that are generated after the RF excitation pulse, have already reached their required strength, already significantly reduces a noise level caused by the measurement.

A further reduction in the noise level, or at least an improvement in the level of tolerance to the generated noise, can be achieved by varying time intervals between successive diffusion modules $DWM_i$ and $DWM_{i+1}$, vary in the planning/optimization of the measurement 100. A certain noise level is still produced at least by the diffusion modules $DWM_i$. An acquisition module $AQM_i$, however, is activated between two successive diffusion modules $DWM_i$, with the result that the time interval between two successive diffusion modules $DWM_i$ equals at least the duration of the intervening acquisition module $AQM_i$. Since in this case an acquisition module $AQM_i$ typically has a duration of several hundred milliseconds, e.g. 200-500 ms, the frequency produced by the diffusion modules $DWM_i$ is already rather low, e.g. in the region of 2-5 Hz. If it is now ensured that successive diffusion modules $DWM_i$ are activated at different time intervals after one another, an even lower frequency is superimposed on this already low frequency.

In order to leave as little measurement time as possible unused, the number of repetitions played out per diffusion module $DWM_i$ is varied. For instance, the number of repetitions WI, WII in an acquisition module $AQM_i$ can be selected such that successive acquisition modules $AQM_i$ have different durations, and hence the time intervals between successive diffusion modules $DWM_i$ vary.

It is possible, for instance, for an acquisition module $AQM_i$, which is used to acquire measurement data MD from a region that includes the center 0 of k-space, to contain significantly fewer WI of the first type, than repetitions WII of the second type, compared to the repetition type ratio contained in an acquisition module $AQM_i$ that is used to acquire measurement data MD from a region that does not include a center 0 of k-space. A particularly advantageous contrast performance can be achieved by the relative reduction in the repetitions contained in acquisition modules $DWM_i$ for acquiring measurement data in the central k-space region.

FIG. 4 shows an exemplary diagram of a diffusion module $DWM_i$ that can be used according to the invention. The top line shows the waveform over time of examples of RF pulses D-RF1, D-RF2, D-RF3 and D-RF4 to be applied. The bottom line shows examples of gradients DG, CG to be switched.

The diffusion module $DWM_i$ can contain three RF pulses D-RF1, D-RF2, D-RF3, which are used to produce a stimulated echo in a known manner by applying a second RF pulse D-RF2 after a time interval δ after a first RF pulse D-RF1, and applying a third RF pulse D-RF3 after a time interval Δ after the first RF pulse D-RF1. The use of stimulated echoes in the diffusion module $DWM_i$ has the advantage, particularly in the subsequent acquisition of measurement data from tissue having a short transverse relaxation rate T2, that diffusion of the spins can take place while the magnetization is stored in the longitudinal direction. This means that more time is available for the diffusion module $DWM_i$, so higher b-values can be achieved.

The diffusion module $DWM_i$ can also contain further RF pulses. For example, an RF pulse D-RF4 can be activated, which is preferably applied at the same time as the stimulated echo produced by the RF pulses D-RF1, D-RF2 and D-RF3, for instance in order to make it easier for a subsequent acquisition module to establish a steady state.

Depending on the desired b-value, diffusion gradients DG having a required gradient strength (amplitude) and gradient duration must be switched between the first RF pulse and the second RF pulse D-RF1 and D-RF2 and after the third RF pulse D-RF3.

Gradients known as crusher (spoiler) gradients CG can also be activated in order to suppress unwanted spin echoes, for instance unwanted stimulated echoes produced by some residual spin coherence (for instance that exists after the last acquisition module).

FIG. 5 schematically illustrates a magnetic resonance apparatus according to the invention. This has a scanner 1 with a basic field magnet 3 that generates the basic magnetic field, a gradient coil unit 5 for generating the gradient fields, an RF antenna 7 for emitting and receiving RF signals, and a control computer 9 designed to perform a method according to the invention. In FIG. 5, these sub-units of the magnetic resonance apparatus are not shown in detail. In particular, the RF antenna 7 may be formed as a number of coils such as the coils 7.1 and 7.2 shown schematically, or more coils, which may either be designed solely to transmit RF signals or solely to receive the induced RF signals, or be designed to do both.

In order to examine a subject U, for example a patient or else a phantom, the subject can be introduced into the scanner 1, into the measurement volume thereof, on a couch bed L. The slice S represents an example of a target volume of the subject U, from which measurement data can be acquired.

The control computer 9 controls the magnetic resonance apparatus and in particular controls the gradient coil unit 5 via a gradient controller 5' controls the RF antenna 7 via an RF transmit/receive controller 7'. The gradient controller 5' has gradient amplifiers (GPA) and transformers that generate the voltages needed for the required gradient fields (not shown). The RF antenna 7 can have a number of channels in which signals can be individually transmitted or received.

The RF antenna 7 together with its RF transmit/receive controller 7' is responsible for generating and emitting (transmitting) an alternating RF field for manipulating nuclear spins in a region of the subject (for example in slices S to be measured), and is designed also to operate local coils, e.g. also an endorectal coil, and a coil array 7.1, 7.2. The center frequency of the alternating RF field, also referred to as the B1 field, must lie close to the resonant frequency of the spins to be manipulated. In order to generate the B1 field, currents are applied to the RF coils, controlled by the RF transmit/receive controller 7'.

The control computer 9 also has a module determination processor 15, which determines diffusion modules and acquisition modules to be played out. These are, in particular a sequence of diffusion modules and acquisition modules to be played out successively, controlled such that a distribution of loads on the GPAs and transformers of the gradient controller 5' is achieved, which is as advantageous as possible, and/or diffusion modules are played out at different frequencies. The control computer 9 is designed overall to perform a method according to the invention for preventing artifacts in the acquisition of MR data from a subject under examination.

An arithmetic unit 13 of the control computer 9 is designed to perform all the processing operations needed for the required measurements and determinations. Intermediate results, and results required for this purpose or calculated in this process can be saved in a memory M of the control computer 9. The units shown need not necessarily be interpreted here as physically separate units but merely constitute a subdivision into logical or functional units, which can be implemented in fewer physical units, or even in just one physical unit.

Via an input/output device E/A of the magnetic resonance apparatus, a user can enter control commands and/or view displayed results from the control computer 9, e.g. image data.

An electronically readable data storage medium 26 is encoded with programming instructions (program code) that cause any or all embodiments of the method as described above to be implemented, when the storage medium 26 is loaded into the control computer of the magnetic resonance apparatus, and the programming instructions are executed by the control computer.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring diffusion-weighted magnetic resonance (MR) data from a subject, comprising:
    operating an MR data acquisition scanner, while a subject is situated therein, in order to execute an MR data acquisition sequence that is specified by an examination protocol, said MR data acquisition sequence comprising a diffusion module containing at least one diffusion gradient, and an acquisition module comprising at least one radio-frequency (RF) pulse and at least one phase-encoding gradient that has a required gradient strength specified by said examination protocol;
    operating said MR data acquisition scanner in said MR data acquisition sequence to (a) activate said diffusion module and to thereafter (b) activate said acquisition module, in which MR data are readout by repetitions of respective RF excitation pulses and phase-encoding gradients that spatially encode the MR data wherein, for at least one of said repetitions, the respective RF excitation pulse thereof is radiated only when the phase-encoding gradients in said acquisition module have reached said required gradient strength;

repeating (a) and (b) until all required MR data are acquired; and providing said MR data to a computer and, from said computer, entering the acquired MR data in a memory organized as k-space.

2. A method as claimed in claim 1 comprising operating said MR data acquisition scanner to activate said diffusion module, in (a), so as to contain at least three diffusion module RF pulses.

3. A method as claimed in claim 1 comprising operating said MR data acquisition scanner to activate said acquisition module, in (b), so as to contain repetitions of a first type in which respective phase encoding gradients have already reached the required gradient strength when the respective RF excitation pulse is applied, and in which said MR data are readout and entered into a first region of said memory organized as k-space, said first region not including a center of k-space.

4. A method as claimed in claim 3 comprising entering the MR data acquired in said first type of repetition along radial trajectories in k-space in said memory organized as k-space.

5. A method as claimed in claim 3 comprising operating said MR data acquisition scanner to activate said acquisition module, in (b), so as to contain repetitions of a second type in which said MR data are readout from a second region, which includes the center of k-space.

6. A method as claimed in claim 5 comprising entering said MR data acquired in said second type of repetitions in a Cartesian pattern in k-space in said memory organized as k-space.

7. A method as claimed in claim 5 comprising operating said MR data acquisition scanner to perform only identical repetitions, either all of said first type or of said second type, in said acquisition module between two of said diffusion modules.

8. A method as claimed in claim 5 comprising operating said MR data acquisition scanner so as to cause a number of said repetitions of said first type in an acquisition module activated between two of said diffusion modules to be greater than a number of repetitions of said second type in said acquisition module between two of said diffusion modules.

9. A method as claimed in claim 8 comprising operating said MR data acquisition scanner in order to cause a diffusion module that is succeeded by an acquisition module containing said second type of repetitions to have a larger b-value than a diffusion module that is succeeded by an acquisition module containing only said first type of repetitions.

10. A method as claimed in claim 1 comprising operating said MR data acquisition scanner so as to cause respective diffusion modules to individually have a respective b-value that decreases dependent on a distance from a center of k-space, in said memory organized as k-space, for the MR data acquired by the acquisition module that immediately follows that respective diffusion module.

11. A method as claimed in claim 1 comprising operating said MR data acquisition scanner to select a sequence of said diffusion modules and said acquisition modules that cause MR data from a region including a center of k-space, in said memory organized as k-space, and MR data from a region that does not include said center of k-space, to not be acquired in one block within a totality of said MR data acquisition sequence.

12. A method as claimed in claim 1 comprising operating said MR data acquisition scanner to select a sequence of said diffusion modules and acquisition modules that minimizes a load on a gradient coil arrangement that produces at least diffusion gradients and readout gradients, said load resulting from either of said gradients being successively activated.

13. A method as claimed in claim 1 comprising operating said MR data acquisition scanner to vary intervals between successive activations of respective diffusion modules.

14. A magnetic resonance apparatus comprising:
an MR data acquisition scanner;
a computer configured to operate said MR data acquisition scanner, while a subject is situated therein, in order to execute an MR data acquisition sequence that is specified by an examination protocol, said MR data acquisition sequence comprising a diffusion module containing at least one diffusion gradient, and an acquisition module comprising at least one radio-frequency (RF) pulse and at least one phase-encoding gradient that has a required gradient strength specified by said examination protocol;
said computer being configured to operate said MR data acquisition scanner in said MR data acquisition sequence to (a) activate said diffusion module and to thereafter (b) activate an acquisition module in which MR data are readout by repetitions of respective RF excitation pulses and phase-encoding gradients that spatially encode the MR data and, for at least one of said repetitions, to radiate the respective RF excitation pulse only when the phase-encoding gradients in said acquisition module have reached said required gradient strength;
said computer being configured to repeat (a) and (b) until all required MR data are acquired; and
said computer being configured to make the acquired MR data into a memory organized as k-space.

15. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
operate said MR data acquisition scanner, while a subject is situated therein, in order to execute an MR data acquisition sequence that is specified by an examination protocol, said MR data acquisition sequence comprising a diffusion module containing at least one diffusion gradient, and an acquisition module comprising at least one radio-frequency (RF) pulse and at least one phase-encoding gradient that has a required gradient strength specified by said examination protocol;
operate said MR data acquisition scanner in said MR data acquisition sequence to (a) activate said diffusion module and to thereafter (b) activate said acquisition module in which MR data are readout by repetitions of respective RF excitation pulses and phase-encoding gradients that spatially encode the MR data and, for at least one of said repetitions, radiate the respective RF excitation pulse only when the phase-encoding gradients in said acquisition module have reached said required gradient strength;
repeat (a) and (b) until all required MR data are acquired; and
enter the acquired MR data into a memory organized as k-space.

* * * * *